United States Patent
Wolk et al.

(10) Patent No.: US 9,586,385 B2
(45) Date of Patent: Mar. 7, 2017

(54) INORGANIC MULTILAYER LAMINATION TRANSFER FILMS

(71) Applicant: 3M INNOVATIVE PROPERTIES COMPANY, St. Paul, MN (US)

(72) Inventors: Martin B. Wolk, Woodbury, MN (US); Michael Benton Free, St. Paul, MN (US); Daniel J. Schmidt, Woodbury, MN (US); Mark J. Pellerite, Woodbury, MN (US); Robert F. Kamrath, Mahtomedi, MN (US); Stephen A. Johnson, Woodbury, MN (US); Terry O. Collier, Woodbury, MN (US); Haefa Mansour, St. Paul, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 100 days.

(21) Appl. No.: 14/470,258

(22) Filed: Aug. 27, 2014

(65) Prior Publication Data
US 2016/0059528 A1   Mar. 3, 2016

(51) Int. Cl.
| H01L 21/02 | (2006.01) |
| H01L 33/46 | (2010.01) |
| B32B 27/28 | (2006.01) |
| B29C 47/00 | (2006.01) |

(Continued)

(52) U.S. Cl.
CPC ........... *B32B 27/283* (2013.01); *B29C 47/00* (2013.01); *H01L 21/022* (2013.01); *H01L 21/02216* (2013.01); *H01L 33/46* (2013.01); *H01L 51/003* (2013.01); *B29C 47/0021* (2013.01); *B29C 47/065* (2013.01); *B32B 2307/416* (2013.01); *B32B 2307/418* (2013.01);

(Continued)

(58) Field of Classification Search
CPC .............................................. B32B 2037/268
See application file for complete search history.

(56) References Cited

U.S. PATENT DOCUMENTS

| RE24,906 E | 12/1960 | Ulrich |
| 4,949,005 A | 8/1990 | Parham |
| 5,849,162 A | 12/1998 | Bartolomei |

(Continued)

FOREIGN PATENT DOCUMENTS

| EP | 2244033 | 10/2010 |
| WO | WO 2010-074862 | 7/2010 |

(Continued)

OTHER PUBLICATIONS

Götschel, "Processing of preceramic paper and ceramic green tape derived multilayer structures," Advances in Applied Ceramics, 2013, vol. 112, No. 6, pp. 358-365.

(Continued)

*Primary Examiner* — Stephen W Smoot
(74) *Attorney, Agent, or Firm* — Jeffrey S. Kollodge

(57) ABSTRACT

The present disclosure relates to inorganic multilayer lamination transfer films, methods of forming these lamination transfer films and methods of using these lamination transfer films. These inorganic multilayer lamination transfer films can have alternating layers including inorganic nanoparticles, sacrificial materials and optionally inorganic precursors that can be densified to form an inorganic optical stack.

27 Claims, 3 Drawing Sheets

(51) Int. Cl.
*H01L 51/00* (2006.01)
*B29C 47/06* (2006.01)

(52) U.S. Cl.
CPC ....... *B32B 2315/08* (2013.01); *B32B 2457/20* (2013.01); *B32B 2551/00* (2013.01)

(56) References Cited

U.S. PATENT DOCUMENTS

| | | | |
|---|---|---|---|
| 5,976,424 | A | 11/1999 | Weber |
| 6,376,590 | B2 | 4/2002 | Kolb |
| 6,396,079 | B1 | 5/2002 | Hayashi |
| 6,582,807 | B2 | 6/2003 | Baer |
| 6,827,886 | B2 | 12/2004 | Neavin |
| 6,849,558 | B2 | 2/2005 | Schaper |
| 7,241,437 | B2 | 7/2007 | Davidson |
| 7,256,936 | B2 | 8/2007 | Hebrink |
| 7,294,298 | B2 | 11/2007 | Iijima |
| 7,508,130 | B2 | 3/2009 | Cok |
| 7,744,987 | B2 | 6/2010 | Hebrink |
| 8,313,798 | B2 | 11/2012 | Nogueira |
| 8,792,165 | B2 * | 7/2014 | Merrill .................. G02B 5/0841 359/489.01 |
| 9,102,131 | B2 * | 8/2015 | Derks ..................... B32B 3/085 |
| 9,246,134 | B2 * | 1/2016 | Schwartz ............ H01L 51/5281 |
| 2005/0141093 | A1 | 6/2005 | Weber |
| 2006/0068128 | A1 | 3/2006 | Greener |
| 2006/0147614 | A1 | 7/2006 | Mizuno |
| 2007/0047080 | A1 * | 3/2007 | Stover ..................... G02B 5/305 359/487.05 |
| 2010/0075136 | A1 * | 3/2010 | Song ........................ B32B 27/34 428/328 |
| 2010/0178480 | A1 | 7/2010 | Colodrero Perez |
| 2010/0272990 | A1 | 10/2010 | Bondesan |
| 2010/0290109 | A1 | 11/2010 | Kurt |
| 2011/0014366 | A1 | 1/2011 | Nogueira |
| 2011/0149400 | A1 | 6/2011 | Miguez Garcia |
| 2013/0101816 | A1 * | 4/2013 | Liu ........................... B32B 7/02 428/212 |
| 2014/0021492 | A1 | 1/2014 | Wolk |
| 2014/0242343 | A1 * | 8/2014 | Free .......................... B44C 1/17 428/164 |
| 2016/0059605 | A1 | 3/2016 | Schmidt |

FOREIGN PATENT DOCUMENTS

| | | |
|---|---|---|
| WO | WO 2013-052927 | 4/2013 |
| WO | WO 2013/165726 | 11/2013 |
| WO | WO 2014-099367 | 6/2014 |

OTHER PUBLICATIONS

Kim, "Effects of the Substrate Pretreatments on the Leakage Current in the Low-Temperature Poly-Si TFTs," Mat. Res. Soc. Symp. Proc., 1997, vol. 448, pp. 419-423.

Kondoh, "Surface treatment of sheet glass. Present status and future prospects," Journal of Non-Crystalline Solids, 1994, vol. 178, pp. 189-198.

Krogman, "Industrial-scale spray layer-by-layer assembly for production of biomimetic photonic systems," Bioinspir. Biomim, Dec. 2013, vol. 8, No. 4, 11 pages.

Kurt, "Structural color via layer-by-layer deposition: layered nanoparticle arrays with near-UV and visible reflectivity bands," Journal of Materials Chemistry, 2009, vol. 19, pp. 8920-8927.

Mistler, Tape Casting: Theory and Practice, Section 2.4 "Binders" 37-45 (2000).

Nicolaidis, "Forming of Ceramic Laminates Comprising Thin Layers of a Few Particles," J. Am. Ceram. Soc., Jul. 2008, vol. 91, No. 7, pp. 2124-2129.

Nogueira, "Spray-Layer-by-Layer Assembly Can More Rapidly Produce Optical-Quality Multistack Heterostructures", Langmuir, 2011, vol. 27, No. 12, pp. 7860-7867.

Park, "Multicomponent Patterning of Layer-by-Layer Assembled polyelectrolyte/Nanoparticle Composite Thin Films with Controlled Alignment", Adv. Mater. 2005, vol. 17, pp. 2575-2579.

Sharmin, "Optimization of binder removal for ceramic microfabrication via polymer co-extrusion," Ceramics International, 2014, vol. 40, pp. 3939-3946.

Shaw, "Negative photoresists for optical lithography," IBM J. Res. Develop., Jan./Mar. 1997, vol. 41, No. 1/2, pp. 81-94.

Shimomura, "Layer-by-Layer-Assembled High-Performance Broadband Antireflection Coatings," ACS Applied Materials & Interfaces, 2010, vol. 2, No. 3, pp. 813-820.

Thomas, "Single-layer $TiO_2$ and multilayer $TiO_2$—$SiO_2$ optical coatings prepared from colloidal suspensions," Applied Optics, Nov. 1, 1987, vol. 26, No. 21, pp. 4688-4691.

Wang, "Patterning of Polymeric/Inorganic Nanocomposite and Nanoparticle Layers," Chem. Mater., 2002, vol. 14, No. 11, pp. 4812-4818.

Wu, "Structural Color in Porous, Superhydrophilic, and Self-Cleaning $SiO_2$/$TiO_2$ Bragg Stacks," Small, 2007, vol. 3, No. 8, pp. 1445-1451.

Yu, "Titania Opal and Inverse Opal Structures via Templating Polyelectrolyte Multilayer Coated Polystyrene Spheres," Current Nanoscience, 2010, vol. 6, No. 2, pp. 206-212.

U.S. Office Action—U.S. Appl. No. 14/470,298, dated Jul. 15, 2016.

Caruso et al, "Production of Hollow Microspheres from Nanostructured Composite Particles," Oct. 13, 1999, American Chemical Society, Chem. Mater., Issue 11, pp. 3309-3314.

* cited by examiner

INORGANIC MULTILAYER LAMINATION TRANSFER FILMS

BACKGROUND

Multilayer optical films (MOFs) have been made by co-extrusion of polymers. The final film can include a large number of alternating polymer layers of high and low refractive index and can be referred to as a Bragg reflector, or a 1-D photonic crystal. Light can be selectively reflected or transmitted at different wavelengths based on constructive interference from light reflected at the layer stack interfaces. MOFs have been designed primarily to reflect IR and/or visible light. Common polymers utilized in MOF includes PEN, PMMA, co-PMMA, PET, co-PET and co-PEN.

SUMMARY

The present disclosure relates to inorganic multilayer lamination transfer films, methods of forming these lamination transfer films and methods of using these lamination transfer films. These inorganic multilayer lamination transfer films can have alternating layers including inorganic nanoparticles, sacrificial materials and optionally inorganic precursors that can be densified to form an inorganic optical stack.

In one aspect, a transfer film includes a plurality of co-extensive layers forming a protolayer stack. Each layer independently includes at least 25 wt % sacrificial material and a thermally stable material and a uniform thickness of less than 25 micrometers.

In another aspect, a transfer film includes a plurality of co-extensive layers forming a protolayer stack. Each layer independently exhibiting a complex viscosity of between $10^3$ and $10^4$ Poise at a shear rate of 100/s when heated to a temperature between its $T_g$ and $T_{dec}$.

In another aspect, a method includes laminating a transfer film, as described herein, to a receptor substrate and then baking out the sacrificial material in the transfer film to form an optical stack.

In another aspect, a method of forming a transfer film includes depositing a plurality of co-extensive layers to form a protolayer stack. Each layer independently includes at least 25 wt % sacrificial material and a thermally stable material and having a uniform thickness of less than 25 micrometers.

In another aspect, a method of forming a transfer film includes depositing a plurality of co-extensive layers to form a protolayer stack. Each layer independently exhibiting a complex viscosity of between $10^3$ and $10^4$ Poise at a shear rate of 100/s when heated to a temperature between its $T_g$ and $T_{dec}$.

In a further aspect, a method of forming a transfer film includes co-extruding a plurality of co-extensive layers to form a protolayer stack. Each layer independently includes at least 25 wt % sacrificial material and a thermally stable material and having a uniform thickness of less than 25 micrometers.

In a further aspect, a method of forming a transfer film includes co-extruding a plurality of co-extensive layers to form a protolayer stack. Each layer independently exhibiting a complex viscosity of between $10^3$ and $10^4$ Poise at a shear rate of 100/s when heated to a temperature between its $T_g$ and $T_{dec}$.

In a further aspect, a transfer film includes a plurality of co-extensive layers forming a protolayer stack. At least selected layers independently include at least 25 wt % sacrificial material and a thermally stable material and a uniform thickness of less than 25 micrometers.

In still a further aspect, In a further aspect, a transfer film includes a plurality of co-extensive layers forming a protolayer stack. At least selected layers independently exhibiting a complex viscosity of between $10^3$ and $10^4$ Poise at a shear rate of 100/s when heated to a temperature between its $T_g$ and $T_{dec}$.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which.

DETAILED DESCRIPTION

Figure 1:
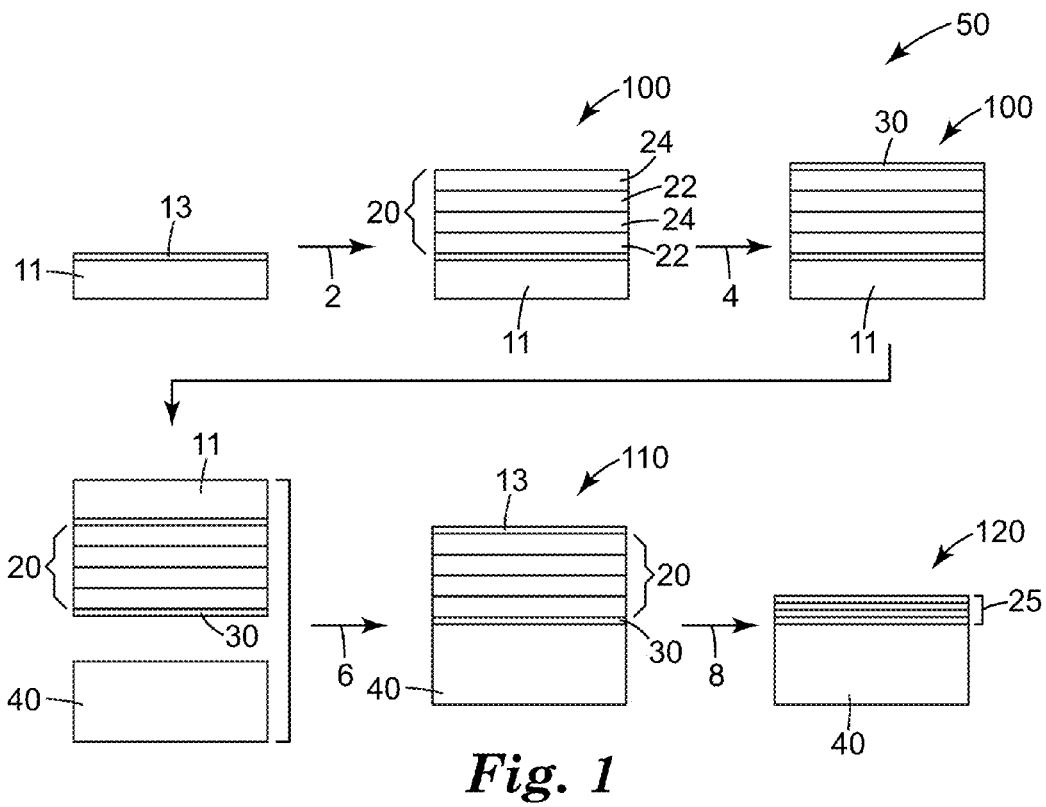
FIG. 1 is a schematic process flow diagram of an illustrative method of forming the transfer film and the optical stack.

In the following detailed description, reference is made to the accompanying drawings that form a part hereof, and in which are shown by way of illustration several specific embodiments. It is to be understood that other embodiments are contemplated and may be made without departing from the scope or spirit of the present disclosure. The following detailed description, therefore, is not to be taken in a limiting sense.

All scientific and technical terms used herein have meanings commonly used in the art unless otherwise specified. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise.

As used in this specification and the appended claims, the term "or" is generally employed in its sense including "and/or" unless the content clearly dictates otherwise.

As used herein, "have", "having", "include", "including", "comprise", "comprising" or the like are used in their open ended sense, and generally mean "including, but not limited to". It will be understood that "consisting essentially of", "consisting of", and the like are subsumed in "comprising," and the like.

In this disclosure:

"bake-out" refers to the process of substantially removing sacrificial material present in a layer by pyrolysis, combustion, sublimation, or vaporization;

"bake-out temperature" refers to the maximum temperature reached during the process of substantially removing sacrificial materials in a layer by pyrolysis or combustion, sublimation, or vaporization;

"combust" or "combustion" refers to a process of heating a layer that comprises organic materials in an oxidizing atmosphere so that organic materials undergo a chemical reaction with the oxidant;

"pyrolyze" or "pyrolysis" refers to a process of heating a sacrificial layer in an inert atmosphere so that organic materials in the article decompose;

"protolayer" refers to a layer in the transfer film that is a transformed to the inorganic or thermally stable layer in the final baked out stack;

"thermally stable" refers to materials that remain substantially intact during the removal of sacrificial materials, materials that can be densified and/or chemically transformed to form inorganic materials;

"polysiloxanes" refers to highly branched oligomeric or polymeric organosilicon compounds and may include carbon-carbon and/or carbon-hydrogen bonds while still being considered as inorganic compounds;

"densify" refers to the process by which the weight and/or volume fraction of the thermally stable material is increased during the bake-out process. For example, in a densified layer the local concentration (weight or volume %) of nanoparticles is increased relative to that in the protolayer. However, the average volume of the individual nanoparticles may not change as a result of the densification process;

"optical stack" refers to two or more layers that in combination produce an optical effect over a range of wavelengths selected from 200 nm to 1 mm;

"optical protolayer stack" refers to two or more layers in the transfer film that are precursors to the optical stack in the final baked-out article, where the optical stack produces an optical effect over a range of wavelengths selected from 200 nm to 1 mm;

"index of refraction," "refractive index," "index," or "RI", refers to a refractive index of a material in the plane of the material with respect to light at 633 nm and normal or near normal (i.e. 8 degrees) incidence, unless otherwise indicated; and "high refractive index" and "low refractive index" are relative terms; when two layers are compared in both in-plane directions of interest, the layer that has a greater average in-plane refractive index is the high refractive index layer, and the layer that has a lower average in-plane refractive index is the low refractive index layer.

The present disclosure relates to inorganic multilayer lamination transfer films, methods of forming these lamination transfer films and methods of using these lamination transfer films. These inorganic multilayer lamination transfer films have alternating layers including inorganic nanoparticles, sacrificial material and optional inorganic precursors that can be densified to form an inorganic optical stack. The transfer films are formed by stacking a plurality of co-extensive layers. This transfer film can be termed a "protolayer" stack. Each layer in this protolayer stack can have a thickness of less than 25 micrometers. Each layer or selected layers in this protolayer stack can have at least 25 wt % sacrificial material. Each layer or selected layers in this protolayer stack can exhibit a complex viscosity of between $10^3$ and $10^4$ Poise at a shear rate of 100/s when heated to a temperature between its $T_g$ and $T_{dec}$. In many embodiments the protolayer stack transmits visible light. These transfer films can be applied to a thermally stable substrate and baked out to integrally form optical elements such as an antireflection coating, a UV reflector, an IR reflector, or solar mirror and the like, for example. While the present disclosure is not so limited, an appreciation of various aspects of the disclosure will be gained through a discussion of the examples provided below.

FIG. 1 is a schematic process flow diagram 50 of an illustrative method of forming the transfer film 100 and the optical stack 25. FIG. 2A-2D are schematic diagrams of the protolayer 20 densification during the bake out step. The transfer film 100 includes a plurality of co-extensive layers (or protolayers) 22 and 24 forming a protolayer stack 20. Each layer 22 and 24 independently includes a sacrificial material 23 and a thermally stable material 21 and a generally uniform co-extensive thickness.

In many embodiments the protolayers 22 and 24 each have a uniform thickness of less than 30 micrometers or less than 25 micrometers or less than 20 micrometers or less than 15 micrometers or are in a range from 1 to 25 micrometers. In other embodiments the protolayers 22 and 24 each have a uniform thickness of less than 1 micrometer or less than 750 nanometers or less than 500 nanometers or less than 250 nanometers or are in a range from 100 to 1000 nanometers.

The protolayer stack 20 and resulting optical stack 25 can be formed of any number of protolayers such as at least 4, at least 10, at least 25, at least 50 or at least 100 layers. With many layers the transmission spectrum of the optical element (following bake-out) can be tailored to meet specific transmission or reflection requirements for a range of electromagnetic radiation. In many embodiments, the protolayer stack 20 and resulting optical stack 25 has visible light transmittance of at least 5%, or at least 10%, or at least 25%, or at least 50%, or at least 75%, or at least 90%. In various embodiments the individual layers of the resulting optical stack 25 cooperate to reflect at least 50% or 75% or 90% visible, IR or UV light.

The formulation of each protolayer 22 and 24 is tailored to provide different properties in the final baked out optical stack. In many embodiments the one or more first protolayers 22 have sacrificial material and a first thermally stable material and the one or more second protolayers 22 have sacrificial material and a second thermally stable material. The first and second thermally stable materials are different materials or different kinds of materials having different physical or optical properties. For example, the formulation of a first protolayer 22 can have thermally stable material or precursor to a thermally stable material that has a different refractive index (by at least 0.1 or at least 0.2 or at least 0.3 or at least 0.4, for example) than the thermally stable material of a second protolayer 24. Examples of these different kinds of materials include inorganic nanomaterials such as silica and zirconia materials, as exemplified in the examples below.

While the protolayer stack 20 is illustrated having four layers of alternating layer formulations 22 and 24 (or A and B), it is understood that protolayer stack 20 can have three different layer formulations A, B and C or four different layer formulations A, B, C and D. In many embodiments the protolayer stack 20 has repeating units such as dyads 22 and 24 (or A and B) or triads A, B, C or quads A, B, C and D.

These repeating unit protolayer stacks 20 can have 1, 2, 3, 4, 5, 6, 7, 8, 9, 10 or more repeating units.

In one embodiment the protolayer stack 20 utilizes four layer formulations A, B, C, D in a six protolayer stack or repeating six layer sequence of CACDBD. This arrangement is illustrated and described for a multilayer optical interference reflecting film in US 2005/0141093. The thickness of each protolayer and subsequent baked-out optical layer can be tailored to suppress higher order light reflections.

The plurality of co-extensive layers (or protolayers) 22 and 24 forming a protolayer stack 20 can be deposited by any coating method or extrusion method, for example. Protolayer formulations with thermoplastic characteristics may be extruded, molded, or (if soluble) solvent cast. Protolayer formulations with thermoset characteristics may be applied by solvent casting followed by solvent removal and thermal or photochemical curing steps. Each of these methods is compatible with roll to roll processing. Multilayers may be obtained by appropriate techniques including multilayer extrusion (e.g., U.S. Pat. No. 6,827,886), multilayer coating, or slide coating. To accomplish these coating or extrusion methods, each layer or selected layers in the protolayer stack can exhibit a complex viscosity of between $10^3$ and $10^4$ Poise at a shear rate of 100/s when heated to a temperature between its $T_g$ and $T_{dec}$.

The protolayer stack 20 can be deposited or formed on a polymeric support layer or carrier layer 11 having a releasable surface 13. In some embodiments, a polymeric support layer or carrier layer 11 is not present. The polymeric support layer or carrier layer 11 can be implemented with a thermally stable flexible film providing mechanical support for the protolayer stack 20. The polymeric support layer 11 has a releasable surface 13, meaning the polymeric support layer 11 allows for release of protolayer stack 20 applied to the releasable surface 13. The polymeric support layer or carrier layer 11 can be thermally stable above 70° C., or alternatively above 120° C. One example of a carrier film is polyethylene terephthalate (PET).

Various polymeric film substrates comprised of various thermosetting or thermoplastic polymers are suitable for use as the polymeric support layer or carrier layer 11. The polymeric support layer or carrier layer 11 may be a single layer or multi-layer film. Illustrative examples of polymers that may be employed as the carrier layer film include (1) fluorinated polymers such as poly(chlorotrifluoroethylene), poly(tetrafluoroethylene-co-hexafluoropropylene), poly(tetrafluoroethylene-co-perfluoro(alkyl)vinylether), poly(vinylidene fluoride-co-hexafluoropropylene); (2) ionomeric ethylene copolymers poly(ethylene-co-methacrylic acid) with sodium or zinc ions such as SURLYN-8920 Brand and SURLYN-9910 Brand available from E. I. duPont de Nemours, Wilmington, Del.; (3) low density polyolefins such as low density polyethylene; linear low density polyethylene; and very low density polyethylene; plasticized vinyl halide polymers such as plasticized poly(vinylchloride); (4) polyethylene copolymers including acid functional polymers such as poly(ethylene-co-acrylic acid) "EAA", poly(ethylene-co-methacrylic acid) "EMA", poly(ethylene-co-maleic acid), and poly(ethylene-co-fumaric acid); acrylic functional polymers such as poly(ethylene-co-alkylacrylates) where the alkyl group is methyl, ethyl, propyl, butyl, and the like, or $CH_3(CH_2)_n$— where n is 0 to 12, and poly(ethylene-co-vinylacetate) "EVA"; and (5) (e.g.) aliphatic polyurethanes. The polymeric support layer or carrier layer 11 can be an olefinic polymeric material, typically comprising at least 50 wt % of an alkylene having 2 to 8 carbon atoms with ethylene and propylene being most commonly employed.

Other polymeric support layers or carrier layers 11 include for example poly(ethylene naphthalate), polycarbonate, poly (meth)acrylate (e.g., polymethyl methacrylate or "PMMA"), polyolefins (e.g., polypropylene or "PP"), polyesters (e.g., polyethylene terephthalate or "PET"), polyamides, polyimides, phenolic resins, cellulose diacetate, cellulose triacetate (TAC), polystyrene, styrene-acrylonitrile copolymers, cyclic olefin copolymers, epoxies, and the like. In some embodiments, the polymeric support layer or carrier layer 11 can include paper, release-coated paper, non-wovens, wovens (fabric), metal films, and metal foils.

In some embodiments, the polymeric support layer or carrier layer 11 can include sacrificial materials that can remain on the protolayer stack 20 during the transfer process. For example, the polymeric support layer or carrier layer 11 can include a PMMA release layer on a PET layer where the release layer remains on the protolayer stack 20 following release from the PET layer. Sacrificial materials (such as the PMMA release layer), can be pyrolyzed by subjecting them to thermal conditions that can vaporize or decompose to volatile byproducts substantially all of the organic material present in the sacrificial layers. In these cases the layer can be called a sacrificial release layer. These sacrificial layers can also be subjected to combustion to burn out all of the organic material present in the sacrificial layer. Typically, a clear, high-purity polymer, such as poly(methyl methacrylate) or poly(ethyl acrylate-co-methyl methacrylate), can be used as the sacrificial material. Useful sacrificial materials leave very low organic residue (ash) after pyrolysis or combustion at the bake-out temperature, typically less than 1 wt % residue.

The protolayer stack 20 can be formed and applied to or disposed on (arrow 2) the support layer or carrier layer 11 by any useful method. In many embodiments, the protolayer stack 20 is formed by sequentially forming each layer 22, 24 on each other. In other embodiments, the protolayer stack 20 is formed by simultaneously extruding or forming each layer 22, 24. A sacrificial adhesive layer 30 can be applied to or disposed on (arrow 4) the protolayer stack 20 to assist in adhering the protolayer stack 20 to the receptor substrate 40 during the lamination process (arrow 6). This laminated transfer film/receptor substrate article 110 can then be baked out (arrow 8) to remove the sacrificial material 23 in the protolayers 22, 24. The resulting baked out article is an optical stack 25. Sacrificial adhesive 30 and any release material 13 can be baked out also leaving the optical stack 25 fixed to the receptor substrate 40.

Examples of receptor substrates 40 include glass such as display mother glass (e.g., backplane mother glass), display cover glass, lighting mother glass, architectural glass, roll glass, and flexible glass. An example of flexible roll glass is commercially available under the trade designation WILLOW glass from Corning Incorporated. Other examples of receptor substrates include metals such as metal parts, sheets and foils. Yet other examples of receptor substrates include gallium nitride, sapphire, silicon, silica, and silicon carbide. In many embodiments the receptor substrate 40 is glass, quartz or sapphire. The receptor substrates 40 can be flat, or curved.

Display backplane mother glass receptor substrates can optionally include a buffer layer on a side of the receptor substrate to which a lamination transfer film is applied. Examples of buffer layers are described in U.S. Pat. No. 6,396,079, which is incorporated herein by reference as if fully set forth. One type of buffer layer is a thin layer of $SiO_2$, as described in K. Kondoh et al., J. of Non-Crystalline Solids 178 (1994) 189-98 and T-K. Kim et al., Mat. Res.

Soc. Symp. Proc. Vol. 448 (1997) 419-23, both of which are incorporated herein by reference as if fully set forth.

A particular advantage of the transfer films and methods described herein is the ability to impart an optical stack to substrates with large surface areas, such as display mother glass or architectural glass. The transfer films 100 described herein have large enough dimensions to be used to impart an optical stack over, at least, entire large digital display substrates (e.g., a 55 inch diagonal AMOLED HDTV, with dimensions of 52 inches wide by 31.4 inches tall), for example.

The sacrificial material in each layer of the protolayer stack 20 can be cleanly baked out leaving a densified layer of thermally stable material defining each layer of the optical stack 25. In some embodiments, the densified layers of thermally stable material can completely or partially fuse into a glass-like material. FIG. 2A-2D are schematic diagrams of the protolayer 20 densification during the bake out step. In some embodiments, the densified layers are not fully dense and have some porosity. Densified layers may have less than 70% porosity, or less than 60% porosity, or less than 50% porosity, or less than 40% porosity, or less than 30% porosity, or less than 20% porosity, or less than 10% porosity, or less than 5% porosity.

Figure 2A:
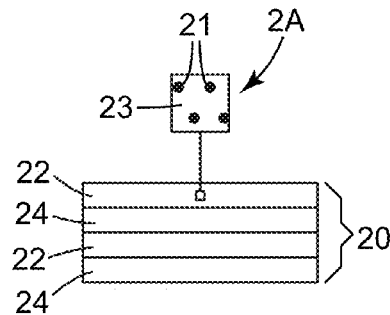
FIG. 2A-2D are schematic diagrams of the protolayer densification during the bake out step.

FIG. 2A illustrates a protolayer stack 20 formed of two co-extensive protolayer pairs 22, 24 stacked on each other. A magnified view of layer 22 is illustrated as 2A and shows the thermally stable material (nanoparticle in this case) 21 dispersed in the sacrificial material 23. It is understood that the counterpart layer pair layer 24 includes a thermally stable material (different than the thermally stable material 21) dispersed in the sacrificial material. In many embodiments the sacrificial material is the same kind or same material in each layer forming the protolayer stack 20. In other embodiments the protolayers have different kinds or types of sacrificial material forming each protolayer of each protolayer pair. The thermally stable material 21 can be present in each protolayer in a range from 1 to 65% wt.

Figure 2B:
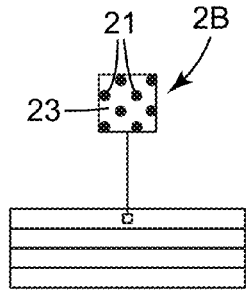
Figure 2C:
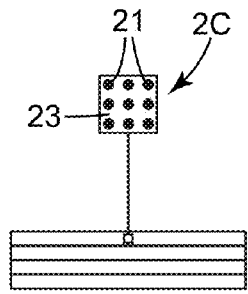
Figure 2D:
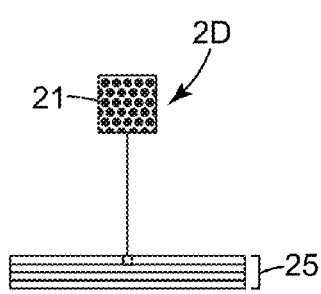

FIG. 2B illustrates a protolayer stack 20 where a portion of the sacrificial material 23 is removed via bake out for example. A magnified view of layer 22 is illustrated as 2B and shows the thermally stable material 21 slightly densified in the sacrificial material 23. FIG. 2C illustrates a protolayer stack 20 where a further portion of the sacrificial material 23 is removed via bake out for example. A magnified view of layer 22 is illustrated as 2C and shows the thermally stable material 21 further densified in the sacrificial material 23. FIG. 2D illustrates an optical stack 25 where the sacrificial material 23 is removed via bake out for example. A magnified view of layer 22 is illustrated as 2D and shows the thermally stable material 21 densified and forming the optical stack 25. In this illustrated embodiment, the thermally stable material includes nanoparticles and binder. The magnified view in FIG. 2D illustrates densified nanoparticles 21 and a small volume between individual nanoparticles. This volume may include open space (e.g., porosity) or thermally stable materials acting as binders for the nanoparticles.

The layers forming the optical stack 25 are co-extensive with each other and each layer has a uniform thickness of less than 5 micrometers or less than 3 micrometers or less than 2 micrometers or less than 1 micrometer or is in a range from 500 nanometers to 2 micrometers. In other embodiments the layers forming the optical stack 25 are co-extensive with each other and each layer has a uniform thickness of less than 500 nanometers or less than 250 nanometers or less than 100 nanometers or are in a range from 40 nanometers to 500 nanometers Thermally Stable Material A thermally stable material is utilized to form the optical stack. The thermally stable material can be densified to form the inorganic optical stack. The thermally stable material includes thermally stable molecular species, for example, that remain substantially intact during the removal of sacrificial materials, such as during "bake out" or pyrolysis. Thermally stable materials include inorganic nanoparticles and optionally polysiloxanes and inorganic residues derived from chemical precursors of inorganic materials.

The thermally stable material includes inorganic nanoparticles. These nanoparticles can be of various sizes and shapes. The nanoparticles can have an average particle diameter less than about 1000 nm, less than about 500 nm, less than about 250 nm, less than about 100 nm, less than about 50 nm, or less than about 35 nm. The nanoparticles can have an average particle diameter from about 3 nm to about 50 nm, or from about 3 nm to about 35 nm, or from about 5 nm to about 25 nm. If the nanoparticles are aggregated, the maximum cross sectional dimension of the aggregated particle can be within any of these ranges, and can also be greater than about 100 nm. "Fumed" nanoparticles, such as silica and alumina, with primary size less than about 50 nm, may also be used, such as CAB-O-SPERSE PG 002 fumed silica, CAB-O-SPERSE 2017A fumed silica, and CAB-O-SPERSE PG 003 fumed alumina, available from Cabot Co., Boston, Mass. Their measurements can be based on transmission electron microscopy (TEM). Nanoparticles can be substantially fully condensed. Fully condensed nanoparticles, such as the colloidal silicas, typically have substantially no hydroxyls in their interiors. Non-silica containing fully condensed nanoparticles typically have a degree of crystallinity (measured as isolated particles) greater than 55%, preferably greater than 60%, and more preferably greater than 70%. For example, the degree of crystallinity can range up to about 86% or greater. The degree of crystallinity can be determined by X-ray diffraction techniques. Condensed crystalline (e.g. zirconia) nanoparticles have a high refractive index whereas amorphous nanoparticles typically have a lower refractive index. Various shapes of the inorganic nanoparticles may be used, such as sphere, rod, sheet, tube, wire, cube, cone, tetrahedron, and the like.

The size of the particles can be chosen to avoid significant visible light scattering in the final article. The nanomaterial selected can impart various optical properties (i.e refractive index, birefringence), electrical properties (e.g conductivity), mechanical properties (e.g toughness, pencil hardness, scratch resistance) or a combination of these properties.

Examples of suitable inorganic nanoparticles include metal nanoparticles or their respective oxides, including the elements zirconium (Zr), titanium (Ti), hafnium (Hf), aluminum (Al), iron (Fe), vanadium (V), antimony (Sb), tin (Sn), gold (Au), copper (Cu), gallium (Ga), indium (In), chromium (Cr), manganese (Mn), cobalt (Co), nickel (Ni), zinc (Zn), yttrium (Y), niobium (Nb), molybdenum (Mo), technetium (Te), ruthenium (Ru), rhodium (Rh), palladium (Pd), silver (Ag), cadmium (Cd), lanthanum (La), tantalum (Ta), tungsten (W), rhenium (Rh), osmium (Os), iridium (Ir), platinum (Pt), cerium (Ce), strontium (Sr) and any combinations thereof (indium tin oxide, for example).

Further examples of suitable inorganic nanoparticles include fluorides such as, magnesium fluoride, calcium fluoride, lead fluoride, aluminum fluoride and barium fluoride. Further examples of suitable inorganic nanoparticles include nitrides such as silicon nitride. Further examples of suitable inorganic nanoparticles include titanates such as, strontium titanate, barium titanate and barium strontium titanate. Further examples of suitable inorganic nanoparticles include mixed metal oxides (for example, aluminosilicates), mixed metal fluorides, mixed nitrides, and mixed metal titanates.

In a preferred embodiment, nanoparticles of zirconium oxide (zirconia) are used. Zirconia nanoparticles can have a particle size from approximately 5 nm to 100 nm, or 5 nm to 25 nm, or 10 nm. Zirconias are commercially available from Nalco Chemical Co. (Naperville, Ill.) under the product designation NALCO OOSSOO8 and from Buhler AG Uzwil, 20 Switzerland under the trade designation "Buhler zirconia Z-WO sol". Zirconia nanoparticles can also be prepared such as described in U.S. Pat. No. 7,241,437 (Davidson et al.) and U.S. Pat. No. 6,376,590 (Kolb et al.). Titania, antimony oxides, alumina, tin oxides, and/or mixed metal oxide nanoparticles can be present in the protolayers or optical stack Other examples of suitable inorganic nanoparticles include elements and alloys known as semiconductors and their respective oxides such as silicon (Si), germanium (Ge), silicon carbide (SiC), silicon germanide (SiGe), aluminium nitride (AlN), aluminium phosphide (AlP), boron nitride (BN), boron carbide ($B_4C$), gallium antimonide (GaSb), indium phosphide (InP), gallium arsenide nitride (GaAsN), gallium arsenide phosphide (GaAsP), indium aluminum arsenide nitride (InAlAsN), zinc oxide (ZnO), zinc selenide (ZnSe), zinc sulfide (ZnS), zinc telluride (ZnTe), mercury zinc selenide (HgZnSe), lead sulfide (PbS), lead telluride (PbTe), tin sulfide (SnS), lead tin telluride (PbSnTe), thallium tin telluride ($Tl_2SnTe_5$), zinc phosphide ($Zn_3P_2$), zinc arsenide ($Zn_3As_2$), zinc antimonide ($Zn_3Sb_2$), lead(II) iodide ($PbI_2$), copper(I) oxide ($Cu_2O$).

Silicon dioxide (silica) nanoparticles can have a particle size from 5 nm to 100 nm or 10 nm to 30 nm or 20 nm. Suitable silicas are commercially available from Nalco Chemical Co. (Naperville, Ill.) under the trade designation NALCO COLLOIDAL SILICAS. For example, silicas include NALCO trade designations 1040, 1042, 1050, 1060, 2327 and 2329. Organosilica is also available under the product names IPA-ST-MS, IPA-ST-L, IPA-ST, IPA-ST-UP, MA-ST-M, and MT-ST from Nissan Chemical America Co. Houston, Tex. and the SNOWTEX ST-40, ST-50, ST-20L, ST-C, ST-N, ST-O, ST-OL, ST-ZL, ST-UP, and ST-OUP, also from Nissan Chemical America Co. Houston, Tex. Suitable fumed silicas include for example, products sold under the tradename, AEROSIL series OX-50, -130, -150, and -200 available from Evonik AG, (Essen, Germany), and CAB-O-SPERSE 2095, CAB-O-SPERSE A105, CAB-O-SIL M5 available from Cabot Corp. (Tuscola, Ill.).

Examples of suitable inorganic nanoparticles include elements known as rare earth elements and their oxides, such as lanthanum (La), cerium ($CeO_2$), praseodymium ($Pr_6O_{11}$), neodymium ($Nd_2O_3$), samarium ($Sm_2O_3$), europium ($Eu_2O_3$), gadolinium ($Gd_2O_3$), terbium ($Tb_4O_7$), dysprosium ($Dy_2O_3$), holmium ($Ho_2O_3$), erbium ($Er_2O_3$), thulium ($Tm_2O_3$), ytterbium ($Yb_2O_3$) and lutetium ($Lu_2O_3$).

The nanoparticles can be treated with a surface treatment agent. Surface-treating the nano-sized particles can provide a stable dispersion in the sacrificial material. Preferably, the surface-treatment stabilizes the nanoparticles so that the particles will be well dispersed in a substantially homogeneous composition. Furthermore, the nanoparticles can be modified over at least a portion of their surface with a surface treatment agent so that the stabilized particle can copolymerize or react with the parts of the composition during curing. In general, a surface treatment agent has a first end that will attach to the particle surface (covalently, ionically or through strong physisorption) and a second end that imparts compatibility of the particle with the composition and/or reacts with the composition during curing. Examples of surface treatment agents include alcohols, amines, carboxylic acids, sulfonic acids, phosphonic acids, silanes and titanates. The preferred type of treatment agent is determined, in part, by the chemical nature of the metal oxide surface. Silanes are preferred for silica and for other siliceous fillers. Silanes and carboxylic acids are preferred for metal oxides such as zirconia. The surface modification can be done either subsequent to mixing with the monomers or after mixing. It is preferred in the case of silanes to react the silanes with the particle or nanoparticle surface before incorporation into the composition. The required amount of surface modifier is dependent upon several factors such as particle size, particle type, modifier molecular weight, and modifier type. In general it is preferred that approximately a monolayer of modifier is attached to the surface of the particle. The attachment procedure or reaction conditions required also depend on the surface modifier used. For silanes, it is preferred to surface treat at elevated temperatures under acidic or basic conditions for from 1-24 hr approximately. Surface treatment agents such as carboxylic acids may not require elevated temperatures or extended time.

Representative embodiments of surface treatment agents suitable for the compositions include compounds such as, for example, isooctyltrimethoxy-silane, N-(3-triethoxysilylpropyl) methoxyethoxyethoxyethyl triethoxysilane ($PEG_3TES$), N-(3-triethoxysilylpropyl) methoxyethoxyethoxyethyl triethoxysilane ($PEG_2TES$), 3-(methacryloyloxy)propyltrimethoxysilane, 3-acryloxypropyltrimethoxysilane, 3-(methacryloyloxy)propyltriethoxysilane, 3-(methacryloyloxy) propylmethyldimethoxysilane, 3-(acryloyloxypropyl)methyldimethoxysilane, 3-(methacryloyloxy)propyldimethylethoxysilane, vinyldimethylethoxysilane, phenyltrimethoxysilane, n-octyltrimethoxysilane, dodecyltrimethoxysilane, octadecyltrimethoxysilane, propyltrimethoxysilane, hexyltrimethoxysilane, vinylmethyldiacetoxysilane, vinylmethyldiethoxysilane, vinyltriacetoxysilane, vinyltriethoxysilane, vinyltriisopropoxysilane, vinyltrimethoxysilane, vinyltriphenoxysilane, vinyltri-t-butoxysilane, vinyltris-isobutoxysilane, vinyltriisopropenoxysilane, vinyltris(2-methoxyethoxy) silane, styrylethyltrimethoxysilane, mercaptopropyltrimethoxysilane, 3-glycidoxypropyltrimethoxysilane, acrylic acid, methacrylic acid, oleic acid, stearic acid, dodecanoic acid, 2-[2-(2-methoxyethoxy)ethoxy]acetic acid (MEEAA), beta-carboxyethylacrylate, 2-(2-methoxyethoxy)acetic acid, methoxyphenyl acetic acid, and mixtures thereof. Further, a proprietary silane surface modifier, commercially available from Momentive, Friendly, W. Va. under the trade designation "Silquest A1230", has been found particularly suitable.

Exemplary polysiloxane resins are available under the trade designation PERMANEW 6000, available from California Hardcoating Company, Chula Vista, Calif. These molecules typically have an inorganic component which leads to high dimensional stability, mechanical strength, and chemical resistance, and an organic component that helps with solubility and reactivity.

Polysiloxane resins useful as thermally stable material belong to a class of the highly branched organosilicon oligomers and polymers of a general formula (as below) which can be further reacted to form crosslinked networks by homo-condensation of Si—OH groups, hetero-condensation with the remaining hydrolyzable groups (e.g. alkoxy), and/or by reactions of the functional organic groups (e.g. ethylenically unsaturated). This class of materials is derived primarily from organosilanes of a general formula:

$$R_xSiZ_{4-x},$$

wherein

R is selected from hydrogen, substituted or unsubstituted $C_1$-$C_{20}$ alkyl, substituted or unsubstituted $C_2$-$C_{10}$ alkylene, substituted or unsubstituted $C_2$-$C_{20}$ alkenylene, $C_2$-$C_{20}$ alkynylene, substituted or unsubstituted $C_3$-$C_{20}$ cycloalkyl, substituted or unsubstituted $C_6$-$C_{20}$ aryl, substituted or unsubstituted $C_6$-$C_{20}$ arylene, a substituted or unsubstituted $C_7$ to $C_{20}$ arylalkyl group, a substituted or unsubstituted $C_1$ to $C_{20}$ heteroalkyl group, a substituted or unsubstituted $C_2$ to $C_{20}$ heterocycloalkyl group, and/or combinations of these.

Z is a hydrolyzable group, such as halogen (containing the elements F, Br, Cl, or I), $C_1$-$C_{20}$ alkoxy, $C_5$-$C_{20}$ aryloxy, and/or combinations of these.

The majority of the composition may consist of $RSiO_{3/2}$ units thus the class of materials is often called silsesquioxanes (or T-resins), however they may also contain mono- ($R_3Si$—$O_{1/2}$), di-($R_2SiO_{2/2}$) and tetrafunctional groups ($Si$—$O_{4/2}$). Organically-modified disilanes of the formula:

$$Z_{3-n}R_nSi—Y—SiR_nZ_{3-n}$$

are often used in the hydrolyzable compostions to further modify the properties of the materials (to form the so-called bridged silsesquioxanes), the R and Z groups are defined above. The materials can be further formulated and reacted with metal alkoxides ($M(OR)_m$) to form metallo-silsesquioxanes.

In many embodiments the highly branched organosilicon oligomers and polymers can be described by a general formula:

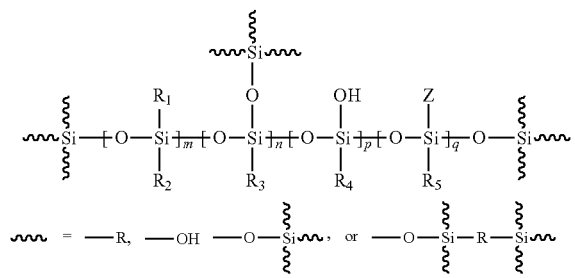

$R_1$ is selected from hydrogen, substituted or unsubstituted $C_1$-$C_{20}$ alkyl, substituted or unsubstituted $C_2$-$C_{10}$ alkylene, substituted or unsubstituted $C_2$-$C_{20}$ alkenylene, $C_2$-$C_{20}$ alkynylene, substituted or unsubstituted $C_3$-$C_{20}$ cycloalkyl, substituted or unsubstituted $C_6$-$C_{20}$ aryl, substituted or unsubstituted $C_6$-$C_{20}$ arylene, a substituted or unsubstituted $C_7$ to $C_{20}$ arylalkyl group, a substituted or unsubstituted $C_1$ to $C_{20}$ heteroalkyl group, a substituted or unsubstituted $C_2$ to $C_{20}$ heterocycloalkyl group, and/or combinations of these;

$R_2$ is selected from hydrogen, substituted or unsubstituted $C_1$-$C_{20}$ alkyl, substituted or unsubstituted $C_2$-$C_{10}$ alkylene, substituted or unsubstituted $C_2$-$C_{20}$ alkenylene, $C_2$-$C_{20}$ alkynylene, substituted or unsubstituted $C_3$-$C_{20}$ cycloalkyl, substituted or unsubstituted $C_6$-$C_{20}$ aryl, substituted or unsubstituted $C_6$-$C_{20}$ arylene, a substituted or unsubstituted $C_7$ to $C_{20}$ arylalkyl group, a substituted or unsubstituted $C_1$ to $C_{20}$ heteroalkyl group, a substituted or unsubstituted $C_2$ to $C_{20}$ heterocycloalkyl group, and/or combinations of these;

$R_3$ is selected from hydrogen, substituted or unsubstituted $C_1$-$C_{20}$ alkyl, substituted or unsubstituted $C_2$-$C_{10}$ alkylene, substituted or unsubstituted $C_2$-$C_{20}$ alkenylene, $C_2$-$C_{20}$ alkynylene, substituted or unsubstituted $C_3$-$C_{20}$ cycloalkyl, substituted or unsubstituted $C_6$-$C_{20}$ aryl, substituted or unsubstituted $C_6$-$C_{20}$ arylene, a substituted or unsubstituted $C_7$ to $C_{20}$ arylalkyl group, a substituted or unsubstituted $C_1$ to $C_{20}$ heteroalkyl group, a substituted or unsubstituted $C_2$ to $C_{20}$ heterocycloalkyl group, and/or combinations of these;

$R_4$ is selected from hydrogen, substituted or unsubstituted $C_1$-$C_{20}$ alkyl, substituted or unsubstituted $C_2$-$C_{10}$ alkylene, substituted or unsubstituted $C_2$-$C_{20}$ alkenylene, $C_2$-$C_{20}$ alkynylene, substituted or unsubstituted $C_3$-$C_{20}$ cycloalkyl, substituted or unsubstituted $C_6$-$C_{20}$ aryl, substituted or unsubstituted $C_6$-$C_{20}$ arylene, a substituted or unsubstituted $C_7$ to $C_{20}$ arylalkyl group, a substituted or unsubstituted $C_1$ to $C_{20}$ heteroalkyl group, a substituted or unsubstituted $C_2$ to $C_{20}$ heterocycloalkyl group, and/or combinations of these;

$R_5$ is selected from hydrogen, substituted or unsubstituted $C_1$-$C_{20}$ alkyl, substituted or unsubstituted $C_2$-$C_{10}$ alkylene, substituted or unsubstituted $C_2$-$C_{20}$ alkenylene, $C_2$-$C_{20}$ alkynylene, substituted or unsubstituted $C_3$-$C_{20}$ cycloalkyl, substituted or unsubstituted $C_6$-$C_{20}$ aryl, substituted or unsubstituted $C_6$-$C_{20}$ arylene, a substituted or unsubstituted $C_7$ to $C_{20}$ arylalkyl group, a substituted or unsubstituted $C_1$ to $C_{20}$ heteroalkyl group, a substituted or unsubstituted $C_2$ to $C_{20}$ heterocycloalkyl group, and/or combinations of these;

Z is a hydrolyzable group, such as halogen (containing the elements F, Br, Cl, or I), $C_1$-$C_{20}$ alkoxy, $C_6$-$C_{20}$ aryloxy, $C_1$-$C_{20}$ acyloxy, and/or combinations of these.

m is an integer from 0 to 500;
n is an integer from 1 to 500;
p is an integer from 0 to 500;
q is an integer from 0 to 100.

As used herein, the term "substituted" refers to one substituted with at least a substituent selected from the group consisting of a halogen (containing the elements F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, alkyl group, a $C_2$ to $C_{20}$ alkenyl group, a $C_2$ to $C_{20}$ alkynyl group, $C_6$ to $C_{30}$ aryl group, a $C_7$ to $C_{13}$ arylalkyl group, a $C_1$ to $C_4$ oxyalkyl group, a $C_1$ to $C_{20}$ heteroalkyl group, a $C_3$ to $C_{20}$ heteroarylalkyl group, a $C_3$ to $C_{30}$ cycloalkyl group, a $C_3$ to $C_{15}$ cycloalkenyl group, a $C_6$ to $C_{15}$ cycloalkynyl group, a heterocycloalkyl group, and a combination thereof, instead of hydrogen of a compound.

The resulting highly branched organosilicon polymer has a molecular weight in a range from 150 to 300,000 Da or preferably in a range from 150 to 30,000 Da.

Sacrificial Materials

The sacrificial material is a material capable of being baked out or otherwise removed while leaving the thermally stable material, substantially intact. The sacrificial material includes, for example, the sacrificial material within each protolayer and the optional sacrificial releasable layer and the optional sacrificial adhesive layer, depending upon a construction of the transfer film. In many embodiments, the sacrificial material is made from a polymerizable composition. Sacrificial material is present in at least selected or each layer of at least 20 wt %, or at least 25 wt %, or at least 30 wt %, or at least 40 wt %, or at least 50 wt %. Sacrificial is present in at least selected or each layer in a range from 20 to 99 wt % or from 25 to 95 wt % or from 30 to 90 wt %, from 40 to 90 wt %, or from 50 to 90 wt %.

Useful polymerizable compositions comprise curable functional groups known in the art, such as epoxide groups, allyloxy groups, (meth)acrylate groups, epoxide, vinyl, hydroxyl, acetoxy, carboxylic acid, amino, phenolic, aldehyde, cinnamate, alkene, alkyne, ethylenically unsaturated groups, vinyl ether groups, and any derivatives and any chemically compatible combinations thereof.

The polymerizable composition used to prepare the sacrificial material may be monofunctional or multifunctional (e.g, di-, tri-, and tetra-) in terms of radiation curable moieties. Examples of suitable monofunctional polymerizable precursors include styrene, alpha-methylstyrene, substituted styrene, vinyl esters, vinyl ethers, octyl (meth) acrylate, nonylphenol ethoxylate (meth)acrylate, isobornyl (meth)acrylate, isononyl (meth)acrylate, 2-(2-ethoxyethoxy) ethyl (meth)acrylate, 2-ethylhexyl (meth)acrylate, lauryl (meth)acrylate, beta-carboxyethyl (meth)acrylate, isobutyl (meth)acrylate, t-butyl (meth)acrylate, cycloaliphatic epoxide, alpha-epoxide, 2-hydroxyethyl (meth)acrylate, isodecyl (meth)acrylate, dodecyl (meth)acrylate, n-butyl (meth)acrylate, methyl (meth)acrylate, hexyl (meth)acrylate, (meth) acrylic acid, N-vinylcaprolactam, stearyl (meth)acrylate, hydroxyl functional caprolactone ester (meth)acrylate, isooctyl (meth)acrylate, hydroxyethyl (meth)acrylate, hydroxypropyl (meth)acrylate, hydroxyisopropyl (meth) acrylate, hydroxybutyl (meth)acrylate, hydroxyisobutyl (meth)acrylate, tetrahydrofurfuryl (meth)acrylate, and any combinations thereof.

Examples of suitable multifunctional polymerizable precursors include ethyl glycol di(meth)acrylate, hexanediol di(meth)acrylate, triethylene glycol di(meth)acrylate, tetraethylene glycol di(meth)acrylate, trimethylolpropane tri (meth)acrylate, tri(meth)acrylate, glycerol tri(meth)acrylate, pentaerythritol tri(meth)acrylate, pentaerythritol tetra(meth) acrylate, neopentyl glycol di(meth)acrylate, bisphenol A di(meth)acrylate, poly(1,4-butanediol) di(meth)acrylate, any substituted, ethoxylated or propoxylated versions of the materials listed above, or any combinations thereof.

The polymerization reactions generally lead to the formation of a three-dimensional "crosslinked" macromolecular network and are also known in the art as negative-tone photoresists, as reviewed by Shaw et al., "Negative photoresists for optical lithography," IBM Journal of Research and Development (1997) 41, 81-94. The formation of the network may occur through either covalent, ionic, or hydrogen bonding, or through physical crosslinking mechanisms such as chain entanglement. The reactions can also be initiated through one or more intermediate species, such as freeradical generating photoinitiators, photosensitizers, photoacid generators, photobase generators, or thermal acid generators. The type of curing agent used depends on the polymerizable precursor used and on the wavelength of the radiation used to cure the polymerizable precursor. Examples of suitable commercially available free-radical generating photoinitiators include benzophenones, benzoin ethers, and acylphosphine photoinitiators, such as those sold under the trade designations "IRGACURE" and "DAROCUR" from Ciba Specialty Chemicals, Tarrytown, N.Y. Other exemplary photoinitiators include 2,2-dimethoxy-2-phenylacetophenone (DMPAP), 2,2-dimethoxyacetophenone (DMAP), xanthone, and thioxanthone.

Co-initiators and amine synergists may also be included to improve curing rates. Suitable concentrations of the curing agent in the crosslinking matrix range from about 1 wt % to about 10 wt %, with particularly suitable concentrations ranging from about 1 wt % to about 5 wt %, based on the entire weight of the polymerizable precursor.

Other materials that may be used for the sacrificial material include, polyvinyl alcohol (PVA), polyethylene oxide (PEO), polyethyleneimine (PEI), ethylcellulose, methylcellulose, polynorbornenes, poly(methylmethacrylate (PMMA), poly(vinylbutyral), poly(cyclohexene carbonate), poly(cyclohexene propylene) carbonate, poly(ethylene carbonate), polypropylene carbonate) and other aliphatic polycarbonates, and any copolymer or blends thereof, and other materials described in chapter 2, section 2.4 "Binders" of R. E. Mistler, E. R. Twiname, Tape Casting: Theory and Practice, American Ceramic Society, 2000. There are many commercial sources for these materials. These materials are typically easy to remove via dissolution or thermal decomposition via pyrolysis or combustion. Thermal heating is typically part of many manufacturing processes and thus removal of the sacrificial material may be accomplished during an existing heating step. For this reason, thermal decomposition via pyrolysis or combustion is a more preferred method of removal.

There are several properties that are preferred in the sacrificial materials. The material are preferably capable of being coated onto a substrate via slide coating, extrusion, knife coating, solvent coating, cast and cure, or other typical coating methods. It is preferred that the materials be solid at room temperature. For thermoplastic sacrificial materials, it is preferred that a working temperature, defined as the range between the glass transition temperature ($T_g$), or the temperature range over which the material exhibits viscosity appropriate for extrusion, and the onset of thermal decomposition ($T_{dec}$) is large enough, such as at least 50 to 100 degrees centigrade, to allow it to be extruded as part of a multilayer film. Polymers used to make films in extrusion operations must exhibit complex viscosity in the range between $10^3$ and $10^4$ Poise at a shear rate of 100/sec. Typically, these polymers have a high enough molecular weight to provide an intrinsic viscosity of 0.4 dl/g as measured per ASTM D4603-91 using a 60/40 mixture of phenol/o-dichlorobenzene as the solvent at 30 degrees centigrade.

Materials that thermally decompose with low ash or low total residue are preferred over those that have higher residues. Residue left behind on a substrate may adversely impact electrical and/or optical properties such as the conductivity, transparency or color of the final product. Since it is desirable to minimize any changes to these properties in the final product, residue levels of less than 1000 ppm are preferred. Residue levels of less than 500 ppm are more preferred and residue levels below 50 ppm are most preferred.

The term "cleanly baked out" means that the sacrificial layer can be removed by pyrolysis or combustion without leaving a substantial amount of residue material such as ash. Examples of preferred residue levels are provided above, although different residue levels can be used depending upon a particular application.

Sacrificial Adhesive Layer

The sacrificial adhesive layer can be implemented with any material enhancing adhesion of the transfer film to the receptor substrate without substantially adversely affecting the performance of the transfer film or resulting optical stack. This layer can also be described as an adhesion promoting layer. The sacrificial adhesive layer appears to facilitate the final permanent bond between the receptor substrate and the baked-out thermally stable structure. The sacrificial adhesive layer is capable of being cleanly baked out during the methods described herein.

Useful sacrificial adhesives or adhesion promoting materials include photoresists (positive and negative), self-assembled monolayers, silane coupling agents, and macromolecules. In some embodiments, silsesquioxanes can function as adhesion promoting layers. Other exemplary materials may include benzocyclobutanes, polyimides, polyamides, silicones, polysiloxanes, silicone hybrid polymers, (meth)acrylates, and other silanes or macromolecules functionalized with a wide variety of reactive groups such as epoxide, episulfide, vinyl, hydroxyl, allyloxy, (meth)acrylate, isocyanate, cyanoester, acetoxy, (meth)acrylamide, thiol, silanol, carboxylic acid, amino, vinyl ether, phenolic, aldehyde, alkyl halide, cinnamate, azide, aziridine, alkene, carbamates, imide, amide, alkyne, and any derivatives or combinations of these groups.

Objects and advantages of this disclosure are further illustrated by the following examples, but the particular materials and amounts thereof recited in these examples, as well as other conditions and details, should not be construed to unduly limit this disclosure.

EXAMPLES

All parts, percentages, ratios, etc. in the examples are by weight, unless noted otherwise. Solvents and other reagents used were obtained from Sigma-Aldrich Corp., St. Louis, Mo. unless specified differently.

Example 1

Coat and Cure

The substrate used in these examples was a 2 mil PET film coated with 6 micron thick PMMA copolymer (75 wt % methyl methacrylate, 25 wt % ethyl acrylate, "PRD510-A", Altuglas Inc.) from a 20 wt % solution of the copolymer in 2-butanone using a roll-to-roll web coating process. The PMMA copolymer release layer was further treated with a solvent barrier by applying a solution of ethoxylated bisphenol A diacrylate (Sartomer SR540) (75 wt %) and Darocur 4265 photoinitiator (2 wt %) in 2-butanone using a #12 wire-wound rod (RD Specialties, Webster, N.Y.). The resulting coating was dried in a forced-air oven at 70° C. for 5 min and cured by passage through a Fusion UV Systems, Inc. Lighthammer UV processor equipped with a D type mercury lamp operated at 100% power and using a conveyor speed of 20 ft/min under nitrogen inerting.

Preparation of Resin A—SR540/Silica

A 2000 ml one-neck round bottom flask equipped with a stir bar, stir plate, heating mantle, condenser and thermocouple/controller was charged with 600 grams of Nalco 2327 (41% solids dispersion of 20 nm colloidal silica in water, Nalco Company, Naperville, Ill.). To this dispersion, 800 grams of 1-methoxy-2-propanol (Alfa Aesar, Ward Hill, Mass.) was added with mixing. The resulting dispersion was a translucent blue mixture. Next, 76.45 grams of Silquest A1230 (Momentive, Friendly, W. Va.) was added to the batch, followed with 100 grams 1-methoxy-2propanol to rinse out the addition beaker. The batch was heated to 80° C. and held for approximately 16 hours, after which it was allowed to cool to room temperature. The water was removed from the batch by alternate vacuum distillation and addition of 1000 grams 1-methoxy-2-propanol. The batch was concentrated by vacuum distillation to result in a very fluid translucent dispersion with 62.5 wt % solids.

A 500 ml 1-neck round bottom flask was charged with 100.0 grams of the 62.5 wt % solids dispersion of A1230-treated Nalco 2327 silica particles prepared above. Next 200.0 grams 1-methoxy-2-propanol (Alfa Aesar, Ward Hill, Mass.) was added to the batch. The batch was held for approximately 15 minutes at room temperature with mixing. Next, 62.5 grams of Sartomer SR540 (Sartomer, Warrington, Pa.) and 0.50 grams of a 5 wt % Prostab 5198 (BASF, Florham Park, N.J.) aqueous solution was added with stirring. The batch was placed on a rotary evaporator and the solvent was removed with vacuum and heating to 60° C. The final mixture was a viscous, nearly clear dispersion, isolated in a yield of 126.0 grams.

Preparation of Resin B—SR540/Zirconia

A 500 ml 3-neck round bottom flask was charged with 100.0 grams of a 45.2 wt % solids dispersion of 10 nm zirconia particles (prepared as described in U.S. Pat. No. 7,241,437 and U.S. Pat. No. 6,376,590). Next, 200.0 grams 1-methoxy-2-propanol (Alfa Aesar, Ward Hill, Mass.) were added to the batch. The batch was held for approximately 15 minutes at room temperature with mixing. Next, 0.38 grams of 5 wt % aqueous solution of Prostab 5198 (BASF, Florham Park, N.J.), 7.32 grams of PEG350 succinate ester acid (prepared from polyethylene glycol 350 and succinic anhydride using methods described in WO 2010 074862) and 48.0 grams of Sartomer SR540 (Sartomer, Warrington, Pa.) were added to the batch with stirring. The batch was placed on a rotary evaporator and the solvent was removed with vacuum and heating to 60° C. The final mixture was a very fluid, nearly clear dispersion, isolated in a yield of 102.3 grams.

Preparation of Coating Formulations

An amber glass screw-top jar was charged with 2.00 g Resin A, 2.50 g 20 wt % partially-capped vinylsilsesquioxane resin in 2-butanone (prepared according to Example 1 in 3M patent application 74705US002, U.S. 61/913,568, filed December 2013), 0.04 g Darocur 4265 photoinitiator, and 38 g 2-butanone. The jar contents were mixed to produce a uniform dispersion (Coating Formulation 1) with 5.97 wt % solids and silica:vinylsilsesquioxane resin ratio 2:1.

A second amber glass screw-top jar was charged with 2.00 g Resin B, 0.50 g zirconium tetrakis(acetylacetonate)(Zr acac, obtained from Sigma-Aldrich, Milwaukee, Wis.), and 0.04 g Darocur 4265 photoinitiator and 38 g 2-butanone. The jar contents were mixed to produce a uniform dispersion (Coating Formulation 2) with 6.27 wt % solids and zirconia:Zr acac ratio 2:1.

Preparation of Lamination Transfer Film and Zirconia/Silica Multilayer Stack on Glass A sheet of the PET/PMMA/SR540 film substrate described above was taped to a glass plate coated side up. It was then coated with Coating Formulation 2 using a #12 wire-wound rod, and the coating was dried in a forced-air oven at 70° C. for 3 min. It was cured by a single pass through a Fusion UV Systems, Inc., Lighthammer UV processor equipped with a D type mercury lamp operated at 100% power and using a conveyor speed of 20 ft/min under nitrogen inerting. Coating Formulation 1 was then applied and cured on the Formulation 2 coating using the same procedure. This sequence was repeated using a second coating of Formulation 2 and a second coating of Formulation 1 to yield a four-layer stack. Finally, a solution of pressure-sensitive adhesive ((isooctyl acrylate (IOA)/acrylic acid (AA)(93/7), as described in U.S. RE24,906(Ulrich), 15 wt % solids in ethyl acetate) was applied using a #15 wire-wound rod, and the resulting coating was dried at 70° C. for 5 min.

Figure 3A:
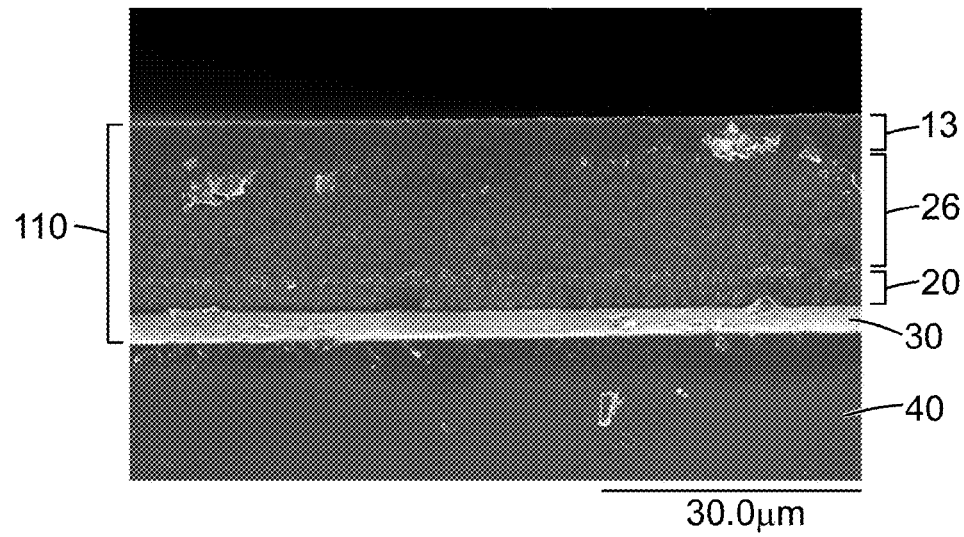
FIG. 3A-3C are SEM images of a four layer optical stack formed by lamination transfer and baking out as described in Example 1.
Figure 3B:
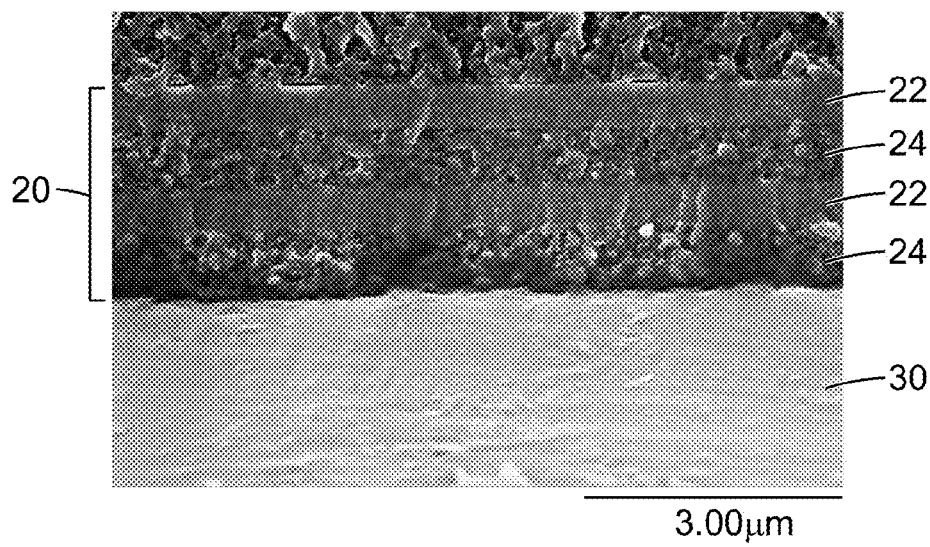

The above adhesive-coated four-layer stack was laminated to a clean glass slide using an adhesive roller, and the film support was removed. FIG. 3A is an SEM image of the laminated transfer film 110 on a receptor substrate 40 (glass). FIG. 3B is a higher magnification SEM image of FIG. 3A. The IOA/AA pressure-sensitive adhesive layer 30 adheres the transfer film to the glass 40. The four layer zirconia 22/silica 24 protolayer stack 20 has a total thickness of about 2.4 micrometers. An optional solvent barrier 26 of SR540 and co-PMMA release layer 13 completes the laminated transfer film 110. The laminated transfer film 110 has a thickness of about 25 micrometers.

Figure 3C:
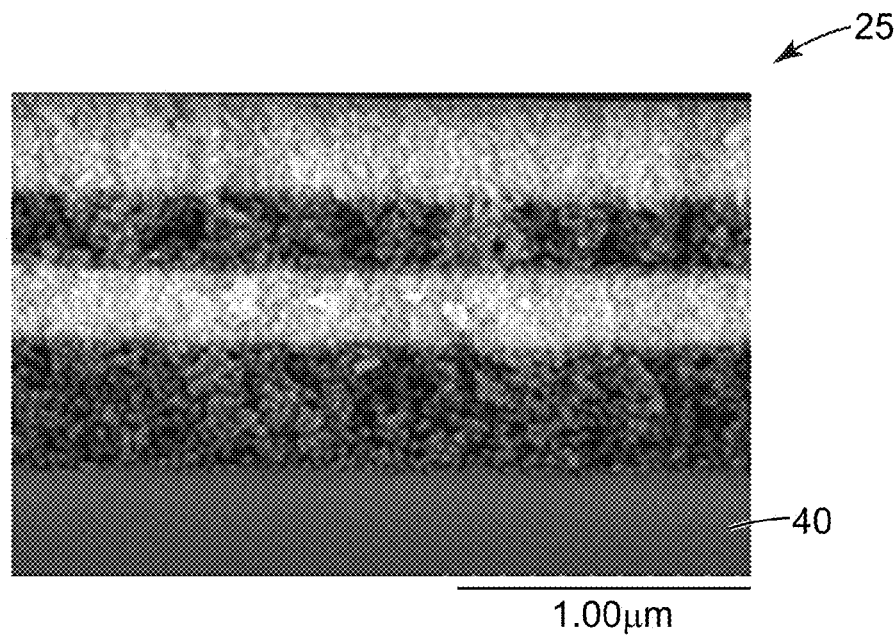

The slide was placed in a ceramic furnace and the temperature was raised to 500° C. at the rate of 10° C./min and kept there for 2 hr, then allowed to cool back to room temperature. The slide was fractured in the coated region and examined by scanning electron microscropy (SEM). A SEM image of the fracture cross-section of this baked-out stack 25 is shown in FIG. 3C. The image shows clearly discrete alternating layers of zirconia and silica remaining after the bake step. Zirconia, coated first on the release substrate, is at the top of the transferred four-layer stack. The baked-out four layer stack 25 has a thickness of about 1.35 micrometers after bake-out, and about 2.4 micrometers before bake-out.

Measurements of visible light transmission (% T) and haze (% H) were made on the lamination transfer stack after lamination to glass and before and after baking, giving the following results: Before bake, 91.7% T, 2.0% H; after bake, 91.2% T, 1.9% H. Results given are averages of two measurements on different locations of the samples, made using a HazeGard Plus (BYK-Gardner USA, Columbia, Md.).

Example 2

Four-Layer Film Formation Via Hot Pressing

Preparation of Surface-Treated Silica Dispersion

A 2000 ml one-neck round bottom flask equipped with a stir bar, stir plate, heating mantle, condenser and thermocouple/controller was charged with 400 grams of Nalco 2327 (41% solids dispersion of 20 nm colloidal silica in water, Nalco Company, Naperville, Ill.). Next, 400 grams of deionized water was added to the flask. A premix of 400 grams of isopropyl alcohol (VWR International, Radnor, Pa.) and 50.96 grams of Silquest A1230 (Momentive, Friendly, W. Va.) was prepared by mixing in a plastic beaker. This premix was added slowly to the flask. The batch was heated to 50° C. and held for approximately 30 minutes. After the 30 minute hold, an additional 400 grams of isopropyl alcohol was added to the batch and the batch was heated to 80° C. The batch was held at 80° C. for approximately 16 hours and then cooled to room temperature. The isopropyl alcohol was removed from the batch by alternate vacuum distillation and addition of 800 grams of deionized water. The batch was concentrated by vacuum distillation to result in a very fluid yellow dispersion with 39.8 wt % solids.

Poly(Ethylene Oxide) (PEO) Solution

A one gallon glass jar was charged with 100 grams of poly(ethylene oxide) (avg MW 200,000 (Aldrich Chemical Company, Inc, Milwaukee, Wis., Catalog No. 18, 199-4)) and 1900 grams deionized water. A stir bar was added to the jar and the capped jar was placed on a stir plate and allowed to stir overnight at moderate agitation. The resultant mixture was a hazy solution. The solution was processed in ~15 ml aliquots with a Centra MP4 centrifuge (International Equipment Company) at 5000 rpm for 5 minutes to separate the solution from a small amount of dispersed silica particles present in the starting polymer solid. The resulting clear solution was decanted into a clean one-gallon glass jar. The solids content of the clear decanted solution was measured at 4.8 wt %.

SA-PEG550 Procedure

A three-liter three-neck round bottom flask was equipped with a mechanical stirrer, thermocouple and condenser. To the flask was added the following: 323.7 grams succinic anhydride, 1.9 grams triethylamine and 1800.7 grams of polyethylene glycol monomethyl ether 550. With good agitation the reaction mixture was heated to 80° C., watching for an initial exotherm as the reaction approached the target temperature. The batch was held at 80° C. for six hours, and then drained to jars for storage.

Zirconia/PEO Masterbatch

A 500 ml three-neck round bottom flask was charged with 30.0 grams of a 45.4 wt % solids dispersion of 10 nm zirconia particles (prepared as described in U.S. Pat. No. 7,241,437 and U.S. Pat. No. 6,376,590). Next, 3.19 grams of SA-PEG550 (prepared as described above) was added to the flask. Finally, 321.8 grams of an aqueous 4.8% solids solution of PEO 200,000 was added to the flask. The mixture was stirred for about 30 minutes and then transferred to a 9 by 13 inch aluminum pan and placed in an 80° C. oven for approximately four hours to drive off the water. The resultant composite mixture was a brittle opaque homogeneous film containing 42 wt % zirconia. The film was broken into approximately one inch squares and placed in a glass jar for storage.

Silica/PEO Masterbatch

A 500 ml three-neck round bottom flask was charged with 50.0 grams of a 39.8 wt % solids dispersion of A1230 silane treated Nalco 2327 (prepared as described above). Next, 49.5 grams of deionized water was added to the flask. Finally, 319.2 grams of an aqueous 4.8% solids PEO 200, 000 solution was added to the flask. The mixture was stirred for about 30 minutes and then transferred to a 9 by 13 inch aluminum pan, air-dried for two days and then placed in an 80° C. oven for approximately four hours to drive off the water. The resultant composite mixture was a brittle opaque homogeneous film containing approximately 43 wt % silica. The film was broken into approximately one inch squares and placed in a glass jar for storage.

Formation of Inorganic Multilayer Stacks

To create the multilayer stacks, aqueous solutions of PEO containing approximately 1 wt % silica ($SiO_2$) or zirconia ($ZrO_2$) nanoparticles were prepared by mixing, in deionized water, appropriate amounts of the above nanoparticle/PEO masterbatches with additional PEO 200,000 (previously treated as described above to remove silica particles present in the material as supplied by the vendor). After stirring at room temperature to dissolve the solids, these solutions were poured into aluminum pans and placed in an oven at 90° C. to evaporate off the water.

Figure 4:
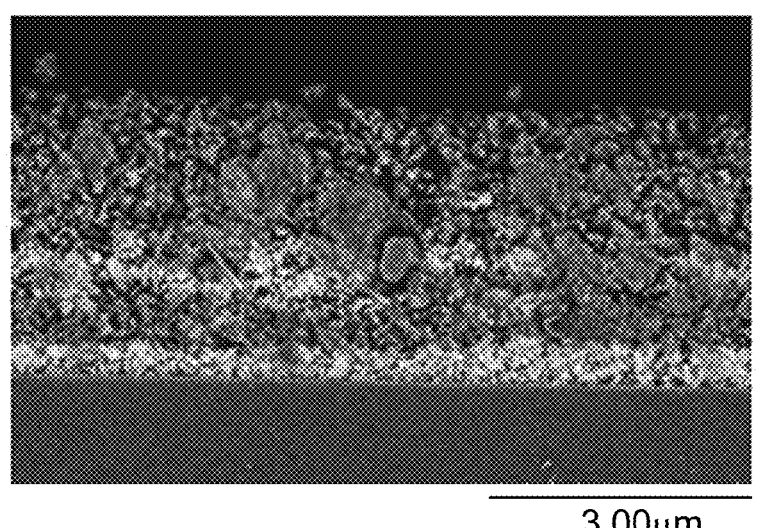
FIG. 4 is an SEM image of a four layer optical stack formed by lamination transfer and baking out as described in Example 2.

The $SiO_2$/PEO and $ZrO_2$/PEO residues were separately hot-pressed for three minutes at 2000 psi and 170° C. to prepare films in a simulated extrusion operation. These films were then cooled and the thinnest portions of each film were layered in an alternating fashion to form four-layer stacks. The four-layer stacks were hot-pressed again for three minutes at 2000 psi and 170° C. The stacks were then placed onto a glass slide and baked for an hour at 550° C. to remove the sacrificial PEO carrier and form alternating layers of $SiO_2$ and $ZrO_2$ nanoparticles (See FIG. 4). The light colored bands or layers are the $ZrO_2$ layers and the darker, less dense bands or layers are the $SiO_2$ layers.

Thus, embodiments of INORGANIC MULTILAYER LAMINATION TRANSFER FILMS are disclosed.

All references and publications cited herein are expressly incorporated herein by reference in their entirety into this disclosure, except to the extent they may directly contradict this disclosure. Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof. The disclosed embodiments are presented for purposes of illustration and not limitation.

What is claimed is:

1. A transfer film comprising:
    a plurality of co-extensive layers forming a protolayer stack, each layer independently comprising at least 25 wt % sacrificial material and a thermally stable material and having a uniform thickness of less than 25 micrometers.

2. The transfer film according to claim 1, further comprising a polymeric support layer having a releasable surface, the releasable surface contacting the protolayer stack.

3. The transfer film according to claim 1, wherein the protolayer stack has a visible light transmittance of at least 5%.

4. The transfer film according to claim 1, wherein at least selected layers comprise inorganic nanoparticle having an average size of less than 250 nm.

5. The transfer film according to claim 1, wherein the protolayer stack comprises a plurality of co-extensive layer pairs, each layer pair comprising a first layer and a second layer each comprising a sacrificial material, the first layers comprising a first thermally stable material and the second layers comprising a second thermally stable material, the first thermally stable material being a different material than the second thermally stable material.

6. The transfer film according to claim 5, wherein the first thermally stable material comprises a first inorganic nanomaterial, and the second thermally stable material comprises a second inorganic nanomaterial, wherein the first inorganic nanomaterial and second inorganic nanomaterial have a refractive index difference of at least 0.2.

7. The transfer film according to claim 1, wherein the thermally stable material comprises a polysiloxane material.

8. The transfer film according to claim 1, wherein the thermally stable material comprises inorganic nanomaterial and a polysiloxane material.

9. The transfer film according to claim 1, wherein the sacrificial material comprises an organic polymer material.

10. The transfer film according to claim 1, wherein the thermally stable material is present in each layer in a range from 1 to 65 wt %.

11. A method, comprising:
    laminating a transfer film according to claim 1 to a receptor substrate;
    baking out the sacrificial material to form an optical stack.

12. The method according to claim 11, wherein each layer of the optical stack independently having a uniform thickness of less than 2 micrometers.

13. A method of forming a transfer film, comprising:
    depositing a plurality of co-extensive layers forming a protolayer stack, each layer independently comprising at least 25 wt % sacrificial material and a thermally stable material and having a uniform thickness of less than 25 micrometers.

14. The method according to claim 13, wherein the protolayer stack has a visible light transmittance of at least 5%.

15. A method of forming a transfer film, comprising:
    co-extruding a plurality of co-extensive layers to form a protolayer stack, each layer independently comprising at least 25 wt % sacrificial material and a thermally stable material and having a uniform thickness of less than 25 micrometers.

16. A transfer film comprising:
    a plurality of co-extensive layers forming a protolayer stack, each layer independently exhibiting a complex viscosity of between $10^3$ and $10^4$ Poise at a shear rate of 100/s when heated to a temperature between its $T_g$ and $T_{dec}$.

17. The transfer film according to claim 16, wherein at least selected layers comprise inorganic nanoparticle having an average size of less than 250 nm.

18. The transfer film according to claim 16, wherein the protolayer stack comprises a plurality of co-extensive layer pairs, each layer pair comprising a first layer and a second layer each comprising a sacrificial material, the first layers comprising a first thermally stable material and the second layers comprising a second thermally stable material, the first thermally stable material being a different material than the second thermally stable material.

19. The transfer film according to claim 16, wherein each layer independently comprises a sacrificial material and a thermally stable material and wherein the thermally stable material comprises a polysiloxane material.

20. The transfer film according to claim 16, wherein each layer independently comprises a sacrificial material and a thermally stable material and wherein the thermally stable material comprises inorganic nanomaterial and a polysiloxane material.

21. The transfer film according to claim 16, wherein each layer independently comprises a sacrificial material and a thermally stable material and wherein the sacrificial material comprises an organic polymer material.

22. The transfer film according to claim 16, wherein each layer independently comprises a sacrificial material and a thermally stable material and wherein the thermally stable material is present in each layer in a range from 1 to 65 wt %.

23. A method, comprising:
    laminating a transfer film according to claim 16 to a receptor substrate;
    baking out the sacrificial material to form an optical stack.

24. The method according to claim 23, wherein the optical stack has a visible light transmittance of at least 10%.

25. A method of forming a transfer film, comprising:
    depositing a plurality of co-extensive layers forming a protolayer stack, each layer independently exhibiting a complex viscosity of between $10^3$ and $10^4$ Poise at a shear rate of 100/s when heated to a temperature between its $T_g$ and $T_{dec}$.

26. The method according to claim 25, wherein the protolayer stack has a visible light transmittance of at least 5%.

27. A method of forming a transfer film, comprising:
co-extruding a plurality of co-extensive layers to form a protolayer stack, each layer independently exhibiting a complex viscosity of between $10^3$ and $10^4$ Poise at a shear rate of 100/s when heated to a temperature between its $T_g$ and $T_{dec}$.

* * * * *